(12) United States Patent
Bozler et al.

(10) Patent No.: US 8,587,106 B2
(45) Date of Patent: Nov. 19, 2013

(54) WIDE BAND AND RADIO FREQUENCY WAVEGUIDE AND HYBRID INTEGRATION IN A SILICON PACKAGE

(75) Inventors: Carl O. Bozler, Waltham, MA (US); Jeremy Muldavin, Chelmsford, MA (US); Peter W. Wyatt, Lincoln, MA (US); Craig L. Keast, Groton, MA (US); Steven Rabe, West Roxbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1328 days.

(21) Appl. No.: 11/761,108

(22) Filed: Jun. 11, 2007

(65) Prior Publication Data

US 2010/0019872 A1    Jan. 28, 2010

Related U.S. Application Data

(60) Provisional application No. 60/812,239, filed on Jun. 9, 2006.

(51) Int. Cl.
*H01L 23/02* (2006.01)

(52) U.S. Cl.
USPC .......................................... 257/680

(58) Field of Classification Search
USPC ............... 257/678–680, 700, 730, 750, 758, 257/E23.001; 333/248; 361/752
See application file for complete search history.

(56) References Cited

U.S. PATENT DOCUMENTS

| | | | |
|---|---|---|---|
| 7,151,425 B2 * | 12/2006 | Park et al. | ...... 333/262 |
| 2005/0166677 A1 | 8/2005 | Nasiri et al. | |
| 2008/0271908 A1 * | 11/2008 | Yamamoto et al. | ...... 174/50.5 |

FOREIGN PATENT DOCUMENTS

EP    1484815    12/2004

OTHER PUBLICATIONS

Muldavin et al., "Wide-Band Low-Loss MEMS Packaging Technology" Microwave Symposium Digest, 2005 IEEE MIT-S International Long Beach, CA USA Jun. 12-17, 2005 pp. 765-768.

* cited by examiner

*Primary Examiner* — Hoa B Trinh
(74) *Attorney, Agent, or Firm* — Gesmer Updegrove LLP

(57) ABSTRACT

A device includes a device wafer having a circuit component formed thereon and having vias formed therein and a cap wafer bonded to the device wafer. The cap wafer has a cavity therein. The cavity has a post formed therein, and the post is positioned to mechanically support the vias formed in the device wafer. The cavity has a volume, the volume substantially enclosing the circuit component formed on the device wafer. The cavity has a width and height such that an impedance of a transmission line is dependent upon the width and height of the cavity, or the impedance of a transmission line is dependent upon the width of a center conductor within the cavity.

78 Claims, 10 Drawing Sheets

WIDE BAND AND RADIO FREQUENCY WAVEGUIDE AND HYBRID INTEGRATION IN A SILICON PACKAGE

PRIORITY INFORMATION

This application claims priority from U.S. Provisional Patent Application Ser. No. 60/812,239, filed on Jun. 9, 2006. The entire content of US Provisional Patent Application, 60/812,239, filed on Jun. 9, 2006, is hereby incorporated by reference.

GOVERNMENT RIGHTS NOTICE

The present invention was made with US Government support under Contract Number, FA8721-05-C-0002, awarded by the US Air Force. The US Government has certain rights to this invention.

FIELD OF THE PRESENT INVENTION

The present invention is directed to radio frequency packaging technology. More particularly, the present invention is directed to radio frequency packaging technology that includes a coaxial wave guide, thereby enabling low loss connections between components inside the package while providing low thermal resistance paths to remove heat.

BACKGROUND OF THE PRESENT INVENTION

In order for micro-electro-mechanical system (MEMS) switches to be practical for use in microwave circuits, MEMS switches must be enclosed in a hermetic package which can exclude moisture for many years. Since the cavity around the MEMS switch must be very small, an extremely low leak rate is required. The package must also be compatible with a low-loss microwave circuit which includes transitions, vias, in and out with a minimum of parasitics and loss.

Moreover, MEMS switches to be practical for use in microwave circuits, the cost of manufacture needs to be relatively low. More specifically, to realize this low cost, a wafer scale process for simultaneous packaging of thousands of circuits having the smallest possible chips sizes would have to be utilized.

Therefore, it is desirable to provide a low cost, low loss hermetically-sealed package for MEMS switches. Moreover, it is desirable to provide a packaging design and process which can provide a hermetic environment for microwave circuits and devices, such as MEMS switches, by combining some of the outstanding properties of single crystal silicon, silicon on insulator, tungsten vias, cavity and post etching in silicon, unique circuit design, and thermo-compression gold bonding. Also, it is desirable to provide a packaging that enables integrated broadband (DC-110 GHz), low-loss, high-isolation, very low-dispersion interconnects, and easy integration into complex circuits by the use of flip-chip bump bonding techniques. Furthermore, it is desirable to provide a packaging that is applicable to mechanical and electromagnetic packaging of a variety solid-state, MEMS, passive microwave structures, and MEMS switches.

SUMMARY OF THE PRESENT INVENTION

One aspect of the present invention is a device. The device includes a device wafer having a circuit component formed thereon and having vias formed therein and a cap wafer bonded to the device wafer. The cap wafer has a cavity therein. The cavity has a post formed therein, and the post is positioned to mechanically support the vias formed in the device wafer. The cavity has a volume, the volume substantially enclosing the circuit component formed on the device wafer.

Another aspect of the present invention is a device. The device includes a device wafer having a circuit component formed thereon; and a cap wafer bonded to the device wafer. The cap wafer has a cavity therein, the cavity having a width and height such that an impedance of a transmission line is dependent upon the width and height of the cavity. The cavity has a volume, the volume substantially enclosing the circuit component formed on the device wafer.

Another aspect of the present invention is a device. The device includes a device wafer having a center conductor formed thereon; and a cap wafer bonded to the device wafer. The cap wafer has a cavity therein, the cavity having a width and height. The center conductor has a width such that an impedance of a transmission line is dependent upon the width of the center conductor.

Another aspect of the present invention is a device. The device includes a device wafer having a circuit component formed thereon; a first cap wafer bonded to a first side of the device wafer; and a second cap wafer bonded to a second side of the device wafer. The first cap wafer has a first cap wafer cavity therein, the first cap wafer cavity having a width and height such that an impedance of a transmission line is dependent upon the width and height of the first cap wafer cavity. The second cap wafer has a second cap wafer cavity therein.

Another aspect of the present invention is a device. The device includes a device wafer having a center conductor formed thereon; a first cap wafer bonded to a first side of the device wafer; and a second cap wafer bonded to a second side of the device wafer. The first cap wafer has a first cap wafer cavity therein, the first cap wafer cavity having a width and height. The center conductor has a width such that an impedance of a transmission line is dependent upon the width of said center conductor. The second cap wafer has a second cap wafer cavity therein.

Another aspect of the present invention is a MEMS switch. The MEMS switch includes a device wafer having a MEMS component formed thereon and having vias formed therein; a cap wafer bonded to the device wafer; and a conductor bonded to the vias. The cap wafer has a cavity therein. The cavity has a post formed therein, and the post is positioned to mechanically support the vias formed in the device wafer. The cavity has a volume, the volume substantially enclosing the MEMS component formed on the device wafer. The volume is additionally designed to form a wide band nominally 50 ohm transmission line structure.

A further aspect of the present invention is a device. The device includes a device wafer having a circuit component formed thereon and having vias formed therein; a first cap wafer bonded to a first side of the device wafer; and a second cap wafer bonded to a second side of the device wafer. The first cap wafer has a first cap wafer cavity therein, the first cap wafer cavity having a post formed therein. The second cap wafer has a second cap wafer cavity therein, the second cap wafer cavity having a post formed therein. The post in the first cap wafer cavity is positioned to mechanically support the vias formed in the device wafer. The post in the second cap wafer cavity is positioned to mechanically support the vias formed in the device wafer. The first cap wafer cavity has a volume, the volume substantially enclosing the circuit component formed on the device wafer. The volumes of the two cap wafers are design to form a wide band nominally 50 ohm transmission line structure

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
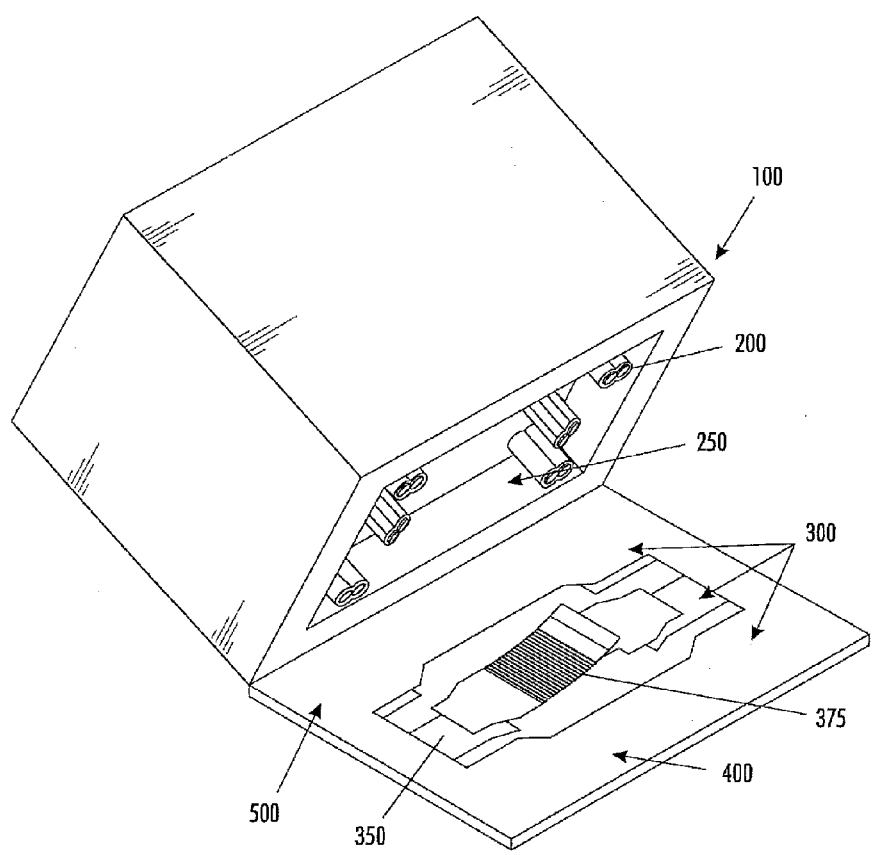
FIGS. 1 and 2 illustrate three dimensional schematics of two packages, one with a switch (FIG. 1) and one with a moisture sensor (FIG. 2) according to the concepts of the present invention.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

As noted above, high reliability DC contact and high capacitance ratio (>80:1) micro-electro-mechanical (MEM) series and shunt switches, as well as, varactors have been employed in a variety of radio-frequency (RF) circuits, including low-loss phase shifters. Conventionally, these low-loss and high quality factor RF MEMS devices have been packaged using wafer capping and planar and vertical feedthroughs. However, the bandwidth and insertion loss of these conventional packages has been limited by the thru-package vias, bond-wires, package resonances, and in-package interconnects.

To address these shortcomings in conventional packaging, the present invention provides a packaging of RF MEMS switches and varactors that do not significantly degrade the RF performance of the MEMS devices (IL<0.1 dB, DC-110 GHz operation), provide interconnects that enable dense packaging of low-loss RF circuits, provide reliable operation of MEMS devices (full range of motion, near-hermetic environment, and controlled ambient), utilizes process technologies compatible with a variety of MEMS technologies, and employs CMOS compatible fabrication techniques on a wafer scale.

As illustrated in FIG. 1, a package 10 includes a silicon-on-insulator (SOI) wafer 400, a deep-silicon etched, micro-machined and metal patterned capping wafer 100, and thermo-compression bonding 500. The wafer 400 allows for low-inductance through-wafer vias 300. The package 10 also includes electrically isolated posts 200 in cavity 250 of capping wafer 100 provide support for bump bonds (1000 of FIG. 3) on the center conductor 350. The cavity 250 of capping wafer 100 provides a volume in which switch 375 can properly operate. The thin substrate wafer 400 and the metal-patterned capping wafer 100 allow for an inverted suspended microstrip-coplanar transmission line with low-loss, low dispersion, ultra-wide bandwidth, and high-isolation. It is noted that flip-chip technologies and bump-bonds allow for easy integration with more complex RF circuits and systems.

Figure 2:
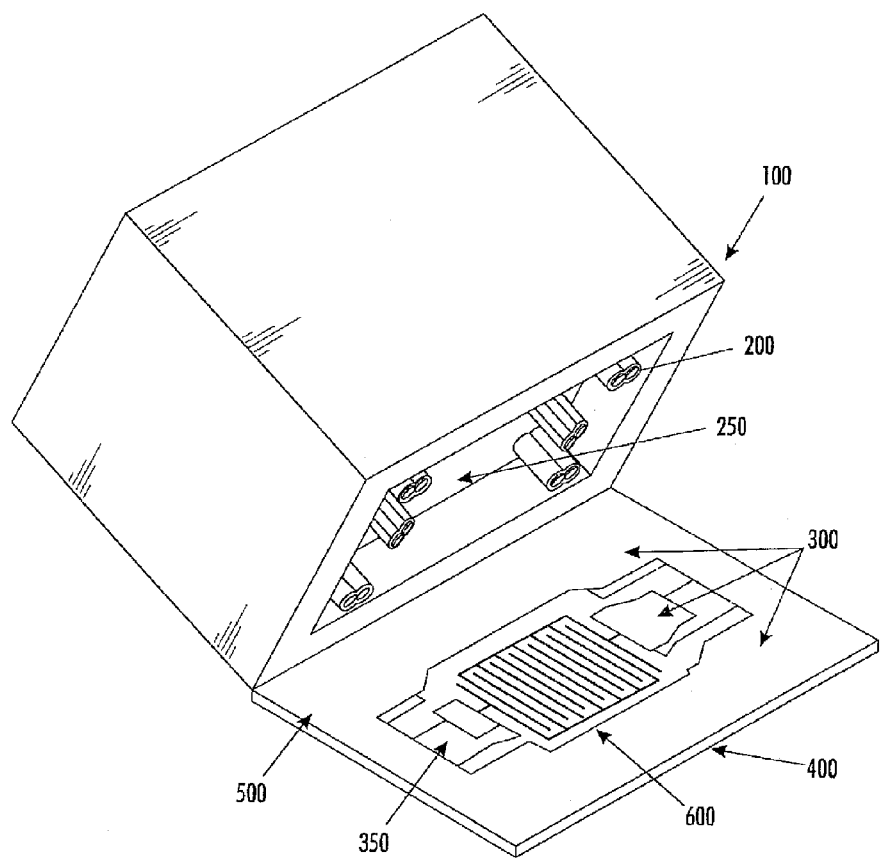

As illustrated in FIG. 2, a package 10 includes a silicon-on-insulator (SOI) wafer 400, a deep-silicon etched, micro-machined and metal patterned capping wafer 100, and thermo-compression bonding 500. The wafer 400 allows for low-inductance through-wafer vias 300. The package 10 also includes electrically isolated posts 200 in cavity 250 of capping wafer 100 provide support for bump bonds (1000 of FIG. 3) on the center conductor 350. Moreover, the package 10 includes an in-situ moisture sensor 600 for monitoring the moisture of the cavity 250 upon hermitic sealing.

Figure 7:
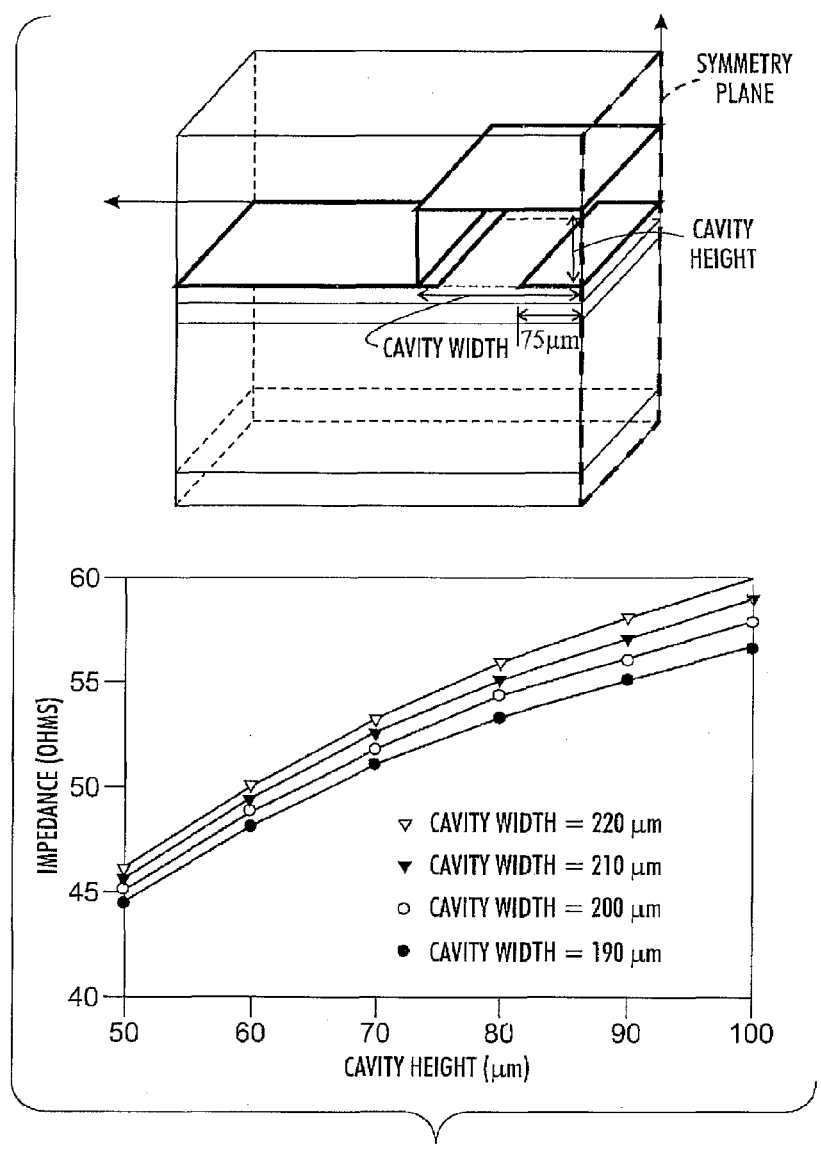
FIG. 7 illustrates computer simulations of waveguide performance according to the concepts of the present invention.

The packaging concept illustrated in FIG. 1 was simulated in Ansoft HFSS™, as illustrated in FIG. 7. The simulation included a coplanar transmission line on a Duroid substrate, bump-bond transitions to the package underside, a through-wafer transition and 500 μm of packaged interconnect. The total length of the simulation is 1 mm. It is noted that the simulation shows that cavity height has a stronger effect than cavity width which implies mostly micro-strip mode.

With respect to FIG. 7, the wafer package is illustrated with a center conductor, with respect to the symmetry plane, having a width of 75 μm. It is noted that the width of the center conductor can be varied independently of the width and/or height of the cavity to vary the impedance of the transmission line. More specifically, the width of the center conductor can be varied from 10 μm to nearly the entire width of the cavity so as to vary the impedance of the transmission line to a desired value.

The height of the cavity 250 was chosen to be 90 μm to accommodate deflection of MEMS switches. The transmission line geometry was chosen based to realize an impedance of approximately 50%. The results of the DC-100 GHz simulation showed wideband performance without package resonances, low insertion loss (<0.25 dB up to 100 GHz), and low return loss. The current and electric fields were mostly confined within the cavity in a mode structure that resembles a channelized, inverted microstrip.

The packaged interconnect geometry can be further optimized by having a coplanar portion of the ground plane extend 25 μm from the edge of the cavity to diminish the sensitivity of the line impedance to the wafer-to-wafer alignment. The cavity width and center conductor width can be varied to modify insertion loss and impedance. For example, a combination of a center conductor width of 130 μm and a cavity width of 280 μm yields an impedance of nearly 50Ω and an attenuation of 0.22 dB/mm at 100 GHz.

It is noted that the width of the cavity may vary from 50 microns to 1000 microns and that the height may vary from 10 microns to 200 microns wherein the actual height and width of the cavity will impact the impedance of the transmission line. As noted above, the graph of FIG. 7 shows examples of various cavity widths and heights and the resulting impedance of the transmission line.

As noted above, the packaging concept of the present invention includes fabrication of the devices on a SOI wafer including vias through the SOI wafer to the buried oxide. An example of an SOI wafer is 25 μm-thick high-resistivity SOI wafer. During much of the processing, the SOI wafer includes a carrier substrate to support and give strength to the thin SOI wafer. The packaging concept of the present invention also includes fabrication of a metal patterned cavity wafer and wafer bonding of the device and cavity wafer. Lastly, the packaging concept of the present invention includes lapping and thinning of the carrier substrate to the buried oxide of the SOI wafer, and backside processing and metallization. It should also be appreciated that the SOI wafer could also be made without the buried oxide using the proper thinning techniques.

As noted above, the packaging concept of the present invention provides a ultra low loss packaging design and process which can provide a hermetic environment for microwave circuits and devices, such as MEMS switches, by combining some of the outstanding properties of single crystal silicon, silicon on insulator (SOI), tungsten vias, cavity and post etching in silicon, unique circuit design, and thermo-compression gold bonding. The present invention provides for integrated broadband (DC-110 GHz), low-loss, high-isolation, and very low-dispersion interconnects. The resultant package is designed for easy integration into complex circuits by the use of flip-chip bump bonding techniques. The present invention is applicable to the mechanical and electromagnetic packaging of a variety solid-state, MEMS, passive microwave structures, and MEMS switches.

In order for MEMS switches to be practical for use in microwave circuits, the MEMS switches must be enclosed in a hermetic package which can exclude moisture for many years. Since the cavity around the switch must be very small, an extremely low leak rate is required. The package must also be compatible with a low-loss microwave circuit which includes transitions, vias (in and out) with a minimum of parasitics and loss.

In one embodiment, silicon single crystal, nearly dislocation free, is utilized to provide an encapsulent because of its exceedingly low diffusion rate of gasses as compared to amorphous and polycrystalline materials, glass, or epoxy. As noted above, FIGS. 1 and 2 illustrate three-dimensional schematics of two packages, one with a switch (FIG. 1) and one with a moisture sensor (FIG. 2).

As noted above, a device substrate 400 of high resistivity, single crystal silicon supports the switch 375 or moisture sensor 600, electrically isolated and fully-filled vias 300, and bump bonds. The substrate 400 allows for low inductance vias 300 through the package 10 and a very low dispersion transmission line. The cover 100 has a metal coated cavity 250 to make room for the switch 375 and form a ground plane of a transmission line. In one embodiment, the cover 100 is over 400 microns thick and provides the mechanical support to the carrier layer 400.

Another feature of the package is posts 200 (with no metal coating) that exist in the cavity 250 over the through-package vias 300 to provide support during probing and bump bonding and ensure an additional seal around the vias 300. Bump bonds are placed on transmission lines outside the package 10 for convenience in placing the packages into a microwave circuit.

Figure 3:
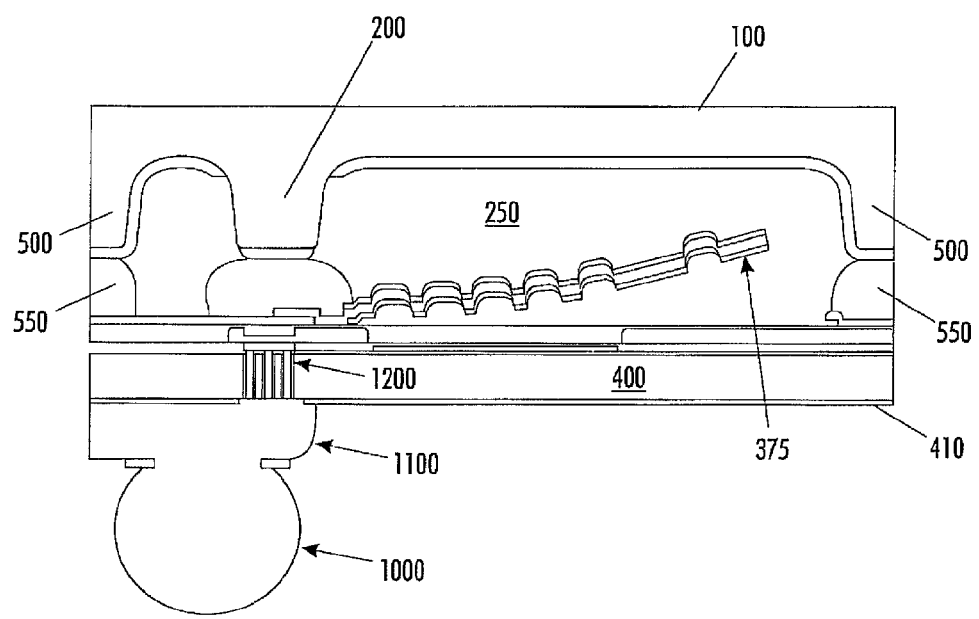
FIG. 3 illustrates shows a schematic of the switch inside the cavity, where the seal around the outside is provided by a thermo-compression gold bond, and where posts are bonded over the tungsten vias for support and to provide an extra seal for hermeticity according to the concepts of the present invention.

FIG. 3 shows a schematic of a switch 375 inside the cavity 250, where the seal 500 around the outside is provided by a thermo-compression gold bond 550, and where posts 200 are bonded over the tungsten vias 1200 for support and to provide an extra seal for hermeticity. A gold transmission line 1100 is connected to the tungsten vias 1200 using a gold bond bump 1000.

The tungsten vias are formed by first etching an array of small holes in the SOI layer 400 using dry deep silicon etch techniques, stopping on the buried oxide layer 410 (BOX), the BOX 410 is then etched in a dry plasma etch tool to expose the silicon carrier substrate 400. The silicon carrier 400 is then etched and the vias 1200 are cleaned and coated with a thermal oxide, having a thickness significantly less than the BOX 410 thickness and thick enough to prevent shorts to the SOI layer 400. The holes are then lined and filled with tungsten using a standard tungsten plug-fill process.

After alignment and bonding, the carrier substrate to the SOI layer 400 is lapped and wet etched down to the BOX 410, exposing the bottom of the oxide coated tungsten vias. A blanket dry oxide etch then exposes the tungsten vias without exposing the SOI layer, completing a hermetic, electrically isolated via.

Figure 4:
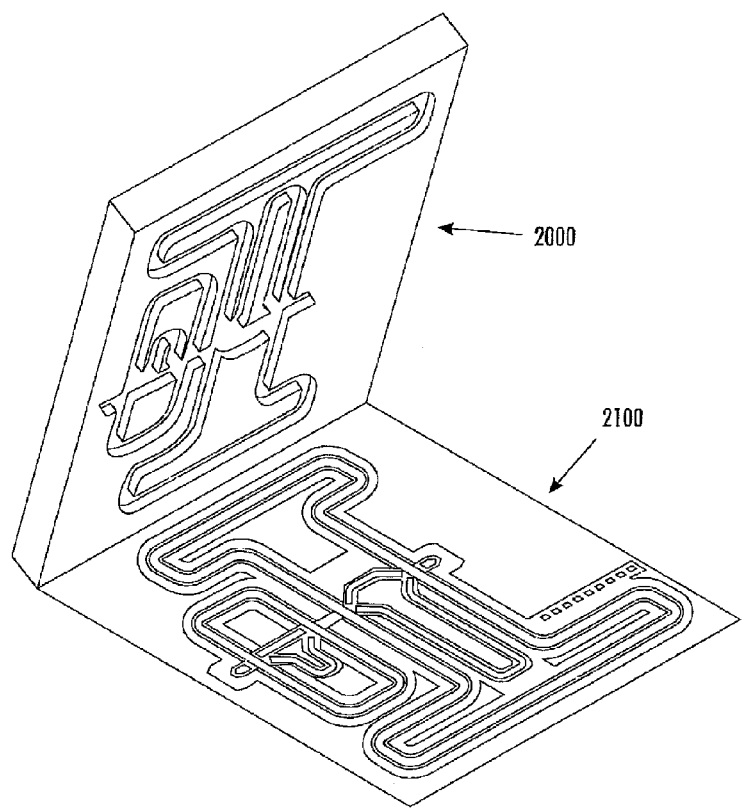
FIGS. 4-6 illustrate a phase shifter with a number of switches and delay lines according to the concepts of the present invention.
Figure 5:
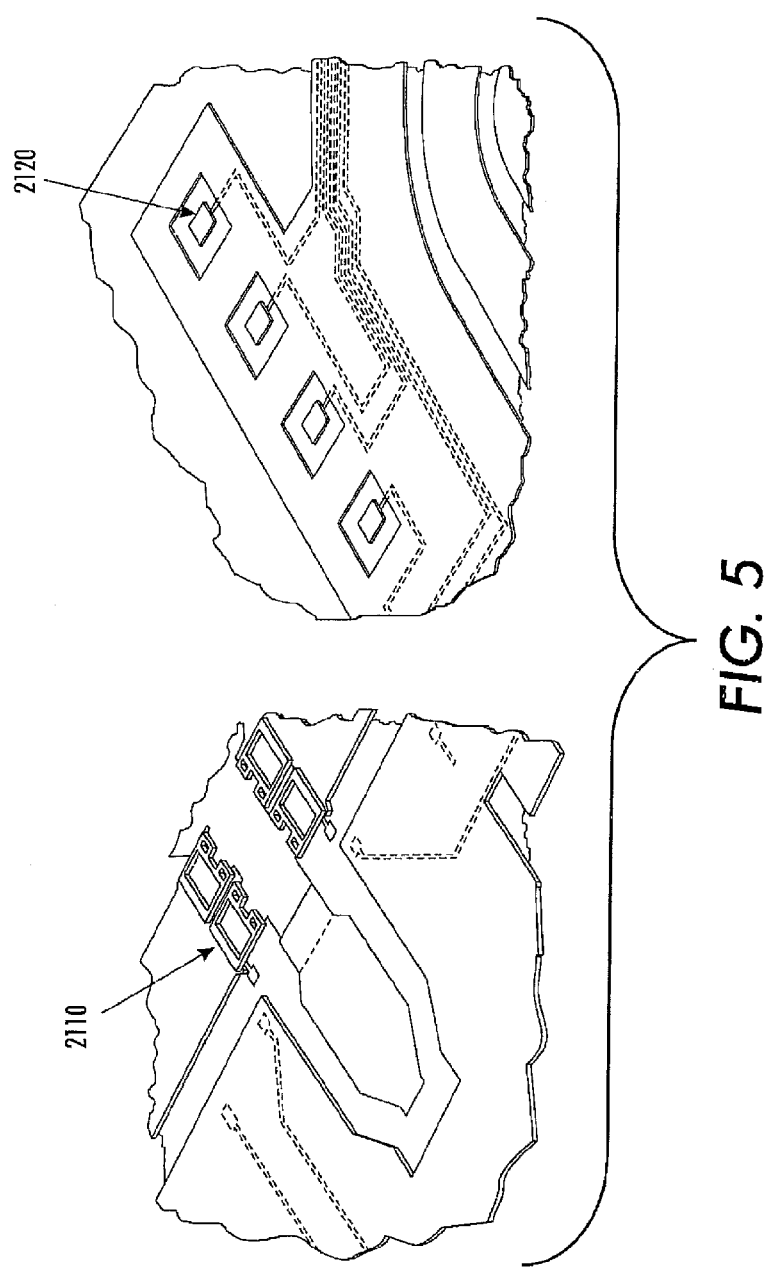
Figure 6:
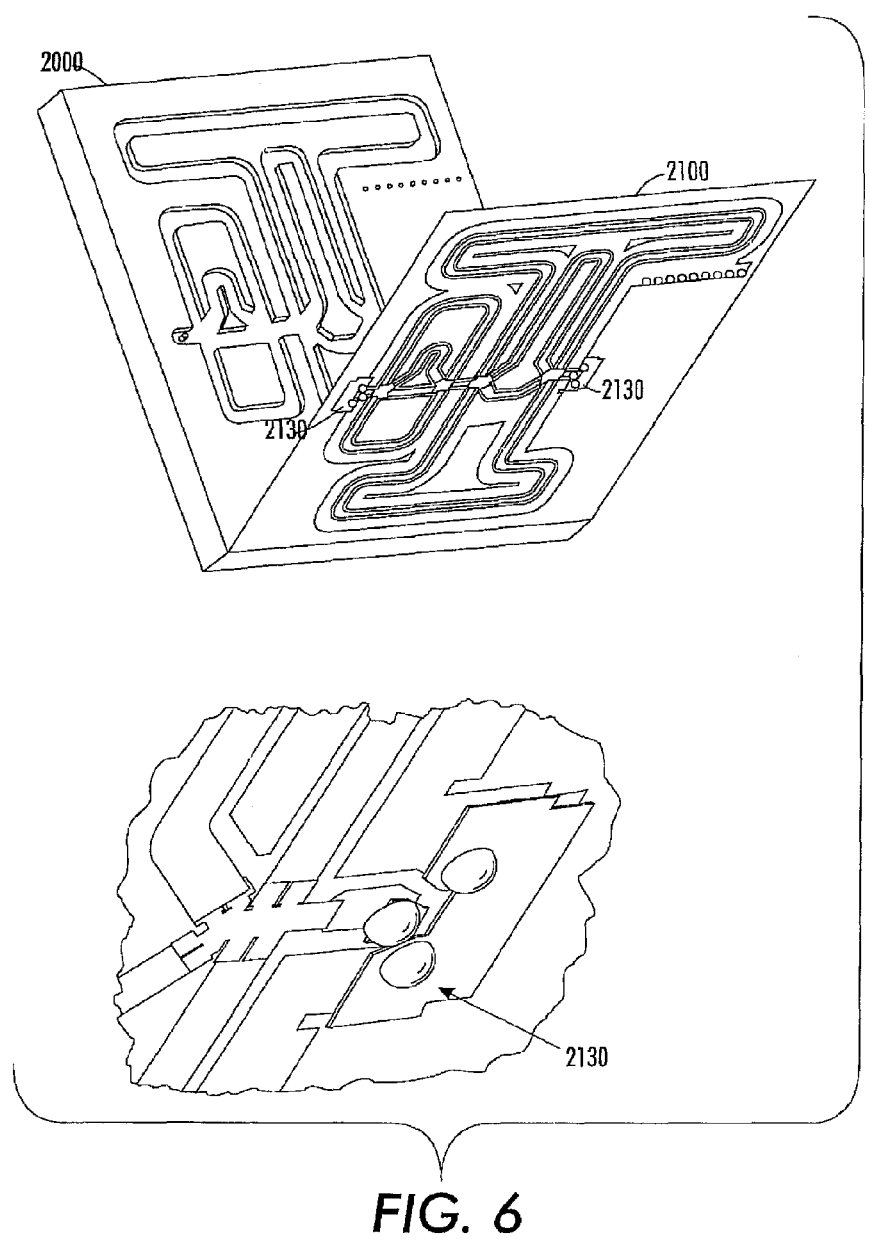

FIGS. 4-6 illustrate a more complicated circuit, a phase shifter. The package includes a cap 2000 and a device substrate 2100. This circuit has a number of switches 2110, DC bias connections 2120, and some delay lines with low frequency bias lines. The circuit is connected to a transmission line by bond bumps 2130.

The circuit of FIGS. 4-6 has the advantage of having low-loss and low dispersion due to the transmission line design with the cover 2000 acting as the ground plane which confines the electromagnetic wave. The transmission line mode is similar to a half-plane coaxial line, and is a mixture of coplanar and inverted microstrip, and allows for low-loss and broad bandwidth interconnects.

It is noted that in the above described embodiments that selective gold patterning can be utilized to support the thru-wafer vias without shorting the center conductor to the ground planes.

It is further noted that the above described embodiments can be utilized in mobile satellite communications, phased array radar, switching networks for satellites, and switches for cell phones.

To fabricate a package, according to the concepts of the present invention, a 150-mm SOI wafer, for example, is used. The 150-mm SOI wafer has a 25 μm-thick high-resistance (>3000 ohm-cm) Silicon single crystal layer on top of a 1 μm-thick buried oxide on top of a standard silicon substrate. A 1 μm-thick thermal oxide is grown on the wafer at 1000° C. under nonslip conditions. Vias are etched through the SOI layer down to the buried oxide, through the oxide and into the carrier substrate using a combination of deep silicon etching in a Plasma Therm Versalock™ plasma etch tool and oxide etching in a Trikon™ plasma etch tool. The vias are cleaned and stripped of polymer before a thermal oxide is grown on the wafers under non-slip conditions at 1000° C. providing electrical isolation between the vias and the substrate. The vias are then lined with sputtered Ti/TiN and filled with CVD tungsten in an Applied Materials™ metal deposition tool. The vias are made planar and the excess tungsten is removed by chemo-mechanical planarization.

At this point in the fabrication, MEMS devices, moisture sensors, or transmission lines can be fabricated on the device wafer. It is noted a planar surface should be maintained in the bonding region of the package.

In one embodiment, the cavity wafer is made from 675 μm-thick high resistivity (>3000 C2-cm) float zone silicon wafer. A 1 μm-thick thermal oxide can be grown under non-slip conditions at 1000° C. The cavity can be patterned and etched into the wafer using a Versalock™ deep silicon etch tool with a modified Bosch™ process to give smooth sidewalls and cavity bottoms and a slight positive slope to the sidewalls. The etch polymers are stripped and an additional 500 μm thermal oxide is grown on the wafer. The wafer is then sputter coated with Ti/Au (300 nm/1 μm) and patterned with an electro-deposited resist to isolate the posts from the cavity metal.

The cavity wafer and the device wafer are bonded such that the bond completely surrounds the cavity and the bond is at least as strong as the fracture strength of silicon and the adhesion of the metal and oxide layers.

The bonded wafers are fully encapsulated in an epoxy that is resistant to a wet chemical etching of silicon. The carrier substrate of the device wafer is lapped to ~50 μm thickness and the remainder is wet chemical etched to the buried oxide in an isotropic wet silicon etch chemistry. The SOI vias are exposed by a blanket dry oxide etch removing the 300 nm thermal oxide and leaving ~700 nm of the buried oxide. Ti/Au (300 nm/1 μm) is sputtered and patterned using a wet chemical etchant.

The S-parameters of a 100 μm-long packaged transmission line packaged according to the concepts of the present invention are an insertion loss at 20 GHz of less than 0.06 dB giving 0.025 dB per transition. The insertion loss at 50 GHz is around 0.1 dB. The measured line loss using the differential line length method is 0.96 dB/cm at 40 GHz, which compares favorably to typical coplanar transmission lines. The measured phase error of a 10.8 mm-long packaged interconnect is less than +1° phase error over the entire measurement band.

The isolation of the packaged interconnects is better than 40 dB at 20 GHz for a separation of only 150 μm and better than 60 dB at 20 GHz for a separation of 600 μm. The isolation is at the noise floor of the measurement system for separation greater than 800 μm. These levels of isolation allow for dense packing of packaged circuits and reduction of cross-talk in multi-chip-modules.

It is noted that the hermeticity of the package, according to the concepts of the present invention, shows no appreciable increase in the leakage current in the moisture sensor after exposure to pressurized steam.

Figure 8:
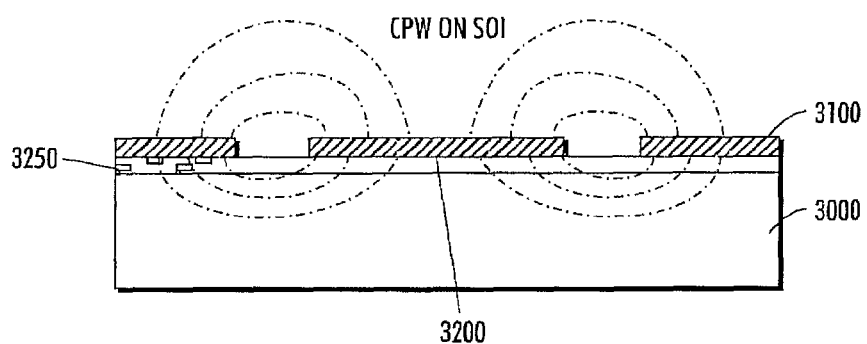
FIGS. 8 and 9 illustrate cross sections of coplanar waveguides.
Figure 9:
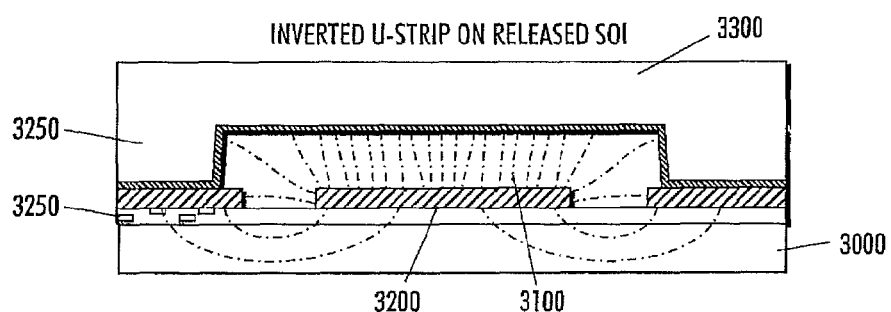

FIG. 8 is a conventional coplanar guide, and FIG. 9 illustrates a demi coax. As illustrated in FIG. 8, a coplanar guide includes a center conductor 3200 fabricated upon a substrate 3000 with vias 3250. Moreover, as illustrated in FIG. 8, field lines 3100 distributed across the center conductor 3200.

In contrast, FIG. 9 illustrates a demi coax wherein a center conductor 3200 is fabricated upon a substrate 3000 with vias 3250. The demi coax also includes a wafer cap 3300 with posts 3350 fabricated above the vias 3250, according to the concepts of the present invention. As illustrated in FIG. 9, field lines 3100 distributed more uniformly across the center conductor 3200 than the field lines 3100 distribution of FIG. 8. Thus, the demi coax of FIG. 9 is much less lossy because the field lines 3100 are distributed more uniformly across the center conductor 3200. The demi coax of FIG. 9 can be utilized in RF CMOS circuits as well as high speed logic interconnects, especially long distance interconnects.

Figure 10:
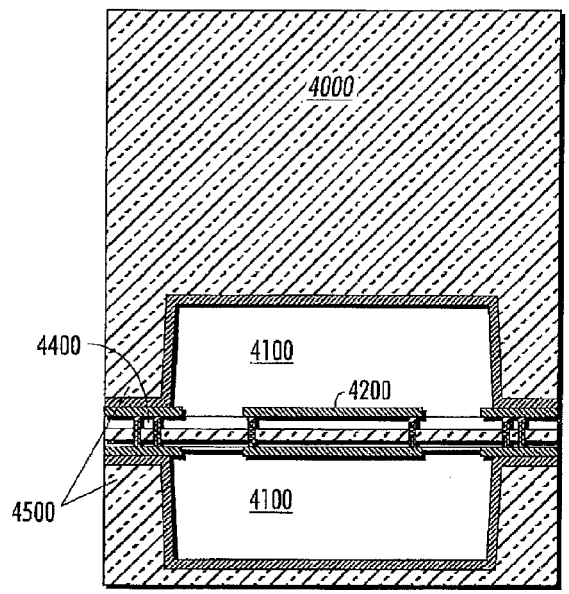
FIG. 10 illustrates a full coaxial structure where two cavities have been etched along the length of the gold transmission line according to the concepts of the present invention.

FIG. 10 illustrates a full coaxial structure having a wafer cap 4000 with posts 4500 fabricated above the internal vias 4400, according to the concepts of the present invention. In this embodiment, two cavities 4100 have been etched along the length of the gold transmission line 4200. The two cavities 4100 enable the field lines to be distributed more uniformly across the gold transmission line 4200 to lower loss and increase isolation. It is noted that the transmission line structures and other components are surrounded by SOI vias providing the connection between the structures on opposite sides of the SOI.

Figure 11:
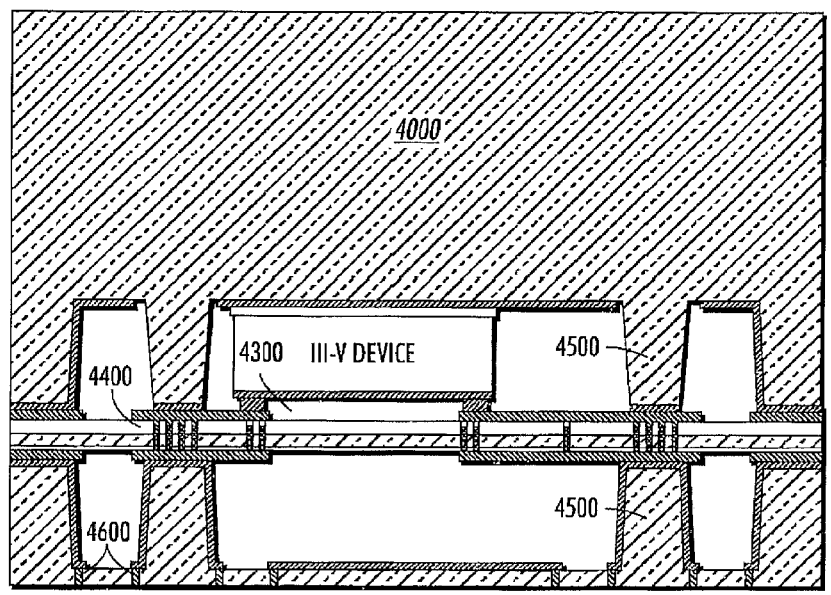
FIG. 11 illustrates a full coaxial structure with an extra cavity containing a GaAs amplifier chip according to the concepts of the present invention.

FIG. 11 illustrates a structure having a wafer cap 4000 with posts 4500 fabricated above the internal vias 4400, according to the concepts of the present invention. In this embodiment, two cavities have been etched around a III-V device; for example a GaAs amplifier chip; wherein the III-V device is mechanically supported in the two cavities by a silicon dioxide layer 4300. As illustrated in FIG. 11, the ground plane of the III-V device is connected to the top of the chamber (cavity), in this case, because the heat flow is upward. It is noted that a silicon pillar may be provided below the III-V device to provide heat removal if the heat flow is downward.

As further illustrated in FIG. 11, two cavities are associated with external vias 4600. It is noted that the transmission line structures and other components are surrounded by silicon via the cavity structures.

It is further noted that the concepts of the present invention can be extended to provide an inductor or a capacitor inside a cavity to provide the space for improved performance and shielding. The cavity may also provide room for the inductor to have a large 3rd dimension for higher Q and more inductance. Moreover, the concepts of the present invention can be extended to embedded CMOS circuits, passives, and coax vias.

Figure 12:
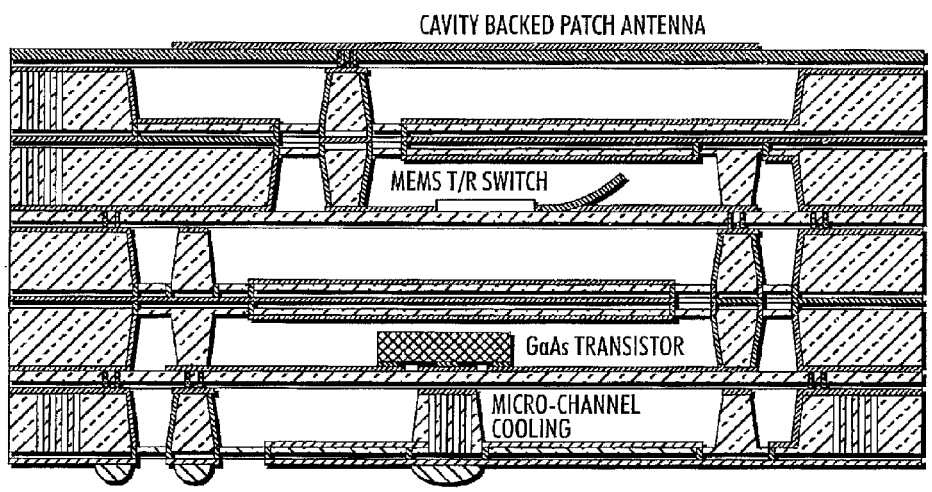
FIGS. 12 and 13 illustrate cross sections of hybrid circuits according to the concepts of the present invention.
Figure 13:
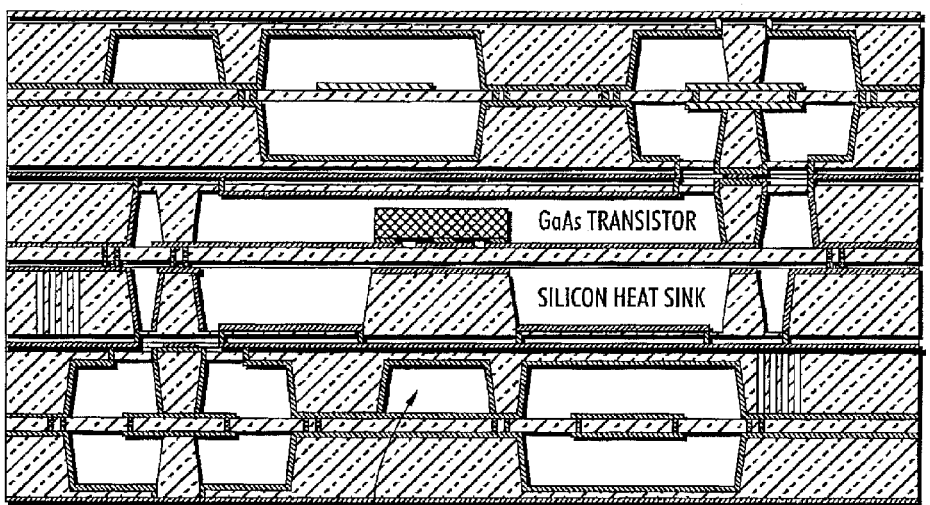

FIGS. 12 and 13 illustrate multi-layer circuits utilizing the packaging concepts of the present invention. The multi-layer circuits of FIGS. 12 and 13 include a wafer cap 4000 with posts 4500 fabricated above the internal vias 4400, according to the concepts of the present invention. Moreover, the multi-layer circuits of FIGS. 12 and 13 include the dual cavity structure so that the transmission line structures and other components are surrounded by silicon via the dual cavity structures. The multi-layer circuits of FIGS. 12 and 13 also include a MEMS Transmission/Receiver switch, a GaAs transistor, a cavity backed patch antenna, micro-channel cooling structures, silicon heat sinks, and transmission lines or conductors.

In summary, the present invention provides a RF packaging technology wherein most of the package material is silicon which mostly surrounds the other components; low loss connections are realized between components inside the package and to the outside; low thermal resistance paths are realized to remove heat where required; cavities inside the package provide room for active and/or passive chips, MEMS, and/or passive elements; the capability to provide digital and/or analog silicon ICs built into the package is realized; and the package can be hermetic. These various features, singly or in combination, can be utilized in the fabrication MEMS RF switches, radar and communications arrays, high efficiency power amplifiers, compact radios, etc.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A device, comprising:
   a device wafer having a circuit component formed thereon; and a cap wafer bonded to said device wafer;
said cap wafer having a cavity therein, said cavity having a width and height such that an impedance of a transmission line is dependent upon said width and height of said cavity;
said cavity having a volume, the volume substantially enclosing said circuit component formed on said device wafer;
said cap wafer being hermetically sealed to said device wafer.

2. The device as claimed in claim 1, wherein said width and height of said cavity create a transmission line having an impedance of 50 ohm.

3. The device as claimed in claim 1, wherein said width and height of said cavity create a transmission line having an impedance of 20 ohm.

4. The device as claimed in claim 1, wherein said width and height of said cavity create a transmission line having an impedance of 75 ohm.

5. The device as claimed in claim 1, wherein said cavity has a width between 50 microns and 1000 microns.

6. The device as claimed in claim 1, wherein said cavity has a height between 10 microns and 200 microns.

7. The device as claimed in claim 5, wherein said cavity has a height between 10 microns and 200 microns.

8. The device as claimed in claim 1, wherein said device wafer is silicon-on-insulator.

9. The device as claimed in claim 1, wherein said wafer cap is silicon.

10. The device as claimed in claim 1, wherein said cavity has a metal layer formed on a surface thereof.

11. The device as claimed in claim 1, wherein said cavity has a layer of gold formed on a surface thereof.

12. The device as claimed in claim 1, wherein said cap wafer is bonded to said device wafer using thermo-compression.

13. The device as claimed in claim 1, wherein said cap wafer is bonded to said device wafer using gold.

14. A device, comprising:
a device wafer having a center conductor formed thereon; and
a cap wafer bonded to said device wafer;
said cap wafer having a cavity therein, said cavity having a width and height;
said center conductor having a width such that an impedance of said center conductor within said cavity is dependent upon said width of said center conductor;
said cap wafer being hermetically sealed to said device wafer.

15. The device as claimed in claim 14, wherein said width of said center conductor creates a transmission line having an impedance of 50 ohm.

16. The device as claimed in claim 14, wherein said width of said center conductor creates a transmission line having an impedance of 20 ohm.

17. The device as claimed in claim 14, wherein said width of said center conductor creates a transmission line having an impedance of 75 ohm.

18. The device as claimed in claim 14, wherein said width of said center conductor has a width between 10 microns and substantially a width of said cavity.

19. The device as claimed in claim 14, wherein said impedance of the transmission line is dependent upon said width of said center conductor and said width of said cavity.

20. The device as claimed in claim 19, wherein said cavity has a width between 50 microns and 1000 microns.

21. The device as claimed in claim 14, wherein said cavity has a width between 50 microns and 1000 microns.

22. The device as claimed in claim 14, wherein said cavity has a height between 10 microns and 200 microns.

23. The device as claimed in claim 21, wherein said cavity has a height between 10 microns and 200 microns.

24. The device as claimed in claim 14, wherein said device wafer is silicon-on-insulator.

25. The device as claimed in claim 14, wherein said wafer cap is silicon.

26. The device as claimed in claim 14, wherein said cavity has a metal layer formed on a surface thereof.

27. The device as claimed in claim 14, wherein said cavity has a layer of gold formed on a surface thereof.

28. The device as claimed in claim 14, wherein said cap wafer is bonded to said device wafer using thermo-compression.

29. The device as claimed in claim 14, wherein said cap wafer is bonded to said device wafer using gold.

30. A device, comprising:
a device wafer having a circuit component formed thereon and having vias formed therein; and
a cap wafer bonded to said device wafer;
said cap wafer having a cavity therein, said cavity having a post formed therein;
said post being positioned to mechanically support said vias formed in said device wafer;
said cavity having a volume, the volume substantially enclosing said circuit component formed on said device wafer;
said cap wafer being hermetically sealed to said device wafer.

31. The device as claimed in claim 30, wherein said device wafer is silicon-on-insulator.

32. The device as claimed in claim 30, wherein said wafer cap is silicon.

33. The device as claimed in claim 30, wherein said cavity has a metal layer formed on a surface thereof.

34. The device as claimed in claim 30, wherein said cavity has a layer of gold formed on a surface thereof.

35. The device as claimed in claim 30, wherein said post is silicon.

36. The device as claimed in claim 30, wherein said cap wafer is bonded to said device wafer using thermo-compression.

37. The device as claimed in claim 30, wherein said cap wafer is bonded to said device wafer using gold.

38. A MEMS switch, comprising:
a device wafer having a MEMS component formed thereon and having vias formed therein;
a cap wafer bonded to said device wafer; and
a conductor bonded to said vias;
said cap wafer having a cavity therein, said cavity having a post formed therein;
said post being positioned to mechanically support said vias formed in said device wafer;
said cavity having a volume, the volume substantially enclosing said MEMS component formed on said device wafer;
said cap wafer being hermetically sealed to said device wafer.

39. The MEMS switch as claimed in claim 38, further comprises a moisture sensor.

40. The MEMS switch as claimed in claim 38, wherein said device wafer is silicon-on-insulator.

41. The MEMS switch as claimed in claim 38, wherein said wafer cap is silicon.

42. The MEMS switch as claimed in claim 38, wherein said cavity has a metal layer formed on a surface thereof.

43. The MEMS switch as claimed in claim 38, wherein said cavity has a layer of gold formed on a surface thereof.

44. The MEMS switch as claimed in claim 38, wherein said post is silicon.

45. The MEMS switch as claimed in claim 38, wherein said cap wafer is bonded to said device wafer using thermo-compression.

46. The MEMS switch as claimed in claim 38, wherein said cap wafer is bonded to said device wafer using gold.

47. The MEMS switch as claimed in claim 38, wherein said vias are bump bonded to said conductor.

48. A device, comprising:
a device wafer having a circuit component formed thereon;
a first cap wafer bonded to a first side of said device wafer; and
a second cap wafer bonded to a second side of said device wafer;
said first cap wafer having a first cap wafer cavity therein, said first cap wafer cavity having a width and height such that an impedance of a transmission line is dependent upon said width and height of said first cap wafer cavity;
said second cap wafer having a second cap wafer cavity therein;
said first and second cap wafers being hermetically sealed to said device wafer.

49. The device as claimed in claim 48, wherein said width and height of said first cap wafer cavity create a transmission line having an impedance of 50 ohm.

50. The device as claimed in claim 48, wherein said width and height of said first cap wafer cavity create a transmission line having an impedance of 20 ohm.

51. The device as claimed in claim 48, wherein said width and height of said first cap wafer cavity create a transmission line having an impedance of 75 ohm.

52. The device as claimed in claim 48, wherein said first cap wafer cavity has a width between 50 microns and 1000 microns.

53. The device as claimed in claim 48, wherein said first cap wafer cavity has a height between 10 microns and 200 microns.

54. The device as claimed in claim 52, wherein said first cap wafer cavity has a height between 10 microns and 200 microns.

55. The device as claimed in claim 48, wherein said second cap wafer cavity includes a heat sink formed therein.

56. The device as claimed in claim 48, wherein said second cap wafer cavity provides micro-channel cooling.

57. A device, comprising:
a device wafer having a center conductor formed thereon;
a first cap wafer bonded to a first side of said device wafer; and
a second cap wafer bonded to a second side of said device wafer;
said first cap wafer having a first cap wafer cavity therein, said first cap wafer cavity having a width and height;
said center conductor having a width such that an impedance of said center conductor is dependent upon said width of said center conductor;
said second cap wafer having a second cap wafer cavity therein;
said first and second cap wafers being hermetically sealed to said device wafer.

58. The device as claimed in claim 57, wherein said width of said center conductor creates a transmission line having an impedance of 50 ohm.

59. The device as claimed in claim 57, wherein said width of said center conductor creates a transmission line having an impedance of 20 ohm.

60. The device as claimed in claim 57, wherein said width of said center conductor creates a transmission line having an impedance of 75 ohm.

61. The device as claimed in claim 57, wherein said width of said center conductor has a width between 10 microns and substantially a width of said cavity.

62. The device as claimed in claim 57, wherein said impedance of the transmission line is dependent upon said width of said center conductor and said width of said cavity.

63. The device as claimed in claim 62, wherein said cavity has a width between 50 microns and 1000 microns.

64. The device as claimed in claim 57, wherein said cavity has a width between 50 microns and 1000 microns.

65. The device as claimed in claim 57, wherein said cavity has a height between 10 microns and 200 microns.

66. The device as claimed in claim 64, wherein said cavity has a height between 10 microns and 200 microns.

67. The device as claimed in claim 57, wherein said second cap wafer cavity includes a heat sink formed therein.

68. The device as claimed in claim 57, wherein said second cap wafer cavity provides micro-channel cooling.

69. A device, comprising:
a device wafer having a circuit component formed thereon and having vias formed therein;
a first cap wafer bonded to a first side of said device wafer; and
a second cap wafer bonded to a second side of said device wafer;
said first cap wafer having a first cap wafer cavity therein, said first cap wafer cavity having a post formed therein;
said second cap wafer having a second cap wafer cavity therein, said second cap wafer cavity having a post formed therein;
said post in said first cap wafer cavity being positioned to mechanically support said vias formed in said device wafer;
said post in said second cap wafer cavity being positioned to mechanically support said vias formed in said device wafer;
said first cap wafer cavity having a volume, the volume substantially enclosing said circuit component formed on said device wafer;
said first and second cap wafers being hermetically sealed to said device wafer.

70. The device as claimed in claim 69, wherein said device wafer is silicon-on-insulator.

71. The device as claimed in claim 69, wherein said first and second cap wafers are silicon.

72. The device as claimed in claim 69, wherein said first and second cap wafer cavities have a metal layer formed on a surface thereof.

73. The device as claimed in claim 69, wherein said first and second cap wafer cavities have a layer of gold formed on a surface thereof.

74. The device as claimed in claim 69, wherein said posts are silicon.

75. The device as claimed in claim 69, wherein said first and second cap wafer are bonded to said device wafer using thermo-compression.

76. The device as claimed in claim 69, wherein said first and second cap wafer are bonded to said device wafer using gold.

77. The device as claimed in claim 69, wherein said second cap wafer cavity includes a heat sink formed therein.

78. The device as claimed in claim 69, wherein said second cap wafer cavity provides micro-channel cooling.

* * * * *